United States Patent
Velappan et al.

(10) Patent No.: US 9,960,307 B2
(45) Date of Patent: May 1, 2018

(54) METHOD FOR PRODUCING THIN-FILM SOLAR CELLS

(71) Applicants: CHINA TRIUMPH INTERNATIONAL ENGINEERING CO., LTD., Shanghai (CN); CTF SOLAR GMBH, Dresden (DE)

(72) Inventors: Krishnakumar Velappan, Dresden (DE); Bastian Siepchen, Dresden (DE); Bettina Späth, Dresden (DE); Christian Drost, Dresden (DE); Shou Peng, Shanghai (CN)

(73) Assignees: China Triumph International Engineering Co., Ltd., Shanghai (CN); CTF SOLAR GMBH, Dresden (DE)

( * ) Notice: Subject to any disclaimer, the term of this patent is extended or adjusted under 35 U.S.C. 154(b) by 0 days. days.

(21) Appl. No.: 14/915,117

(22) PCT Filed: Aug. 27, 2014

(86) PCT No.: PCT/EP2014/068193
§ 371 (c)(1),
(2) Date: Feb. 26, 2016

(87) PCT Pub. No.: WO2015/028520
PCT Pub. Date: Mar. 5, 2015

(65) Prior Publication Data
US 2016/0240715 A1    Aug. 18, 2016

(30) Foreign Application Priority Data
Aug. 30, 2013    (CN) .......................... 2013 1 0472442

(51) Int. Cl.
*H01L 31/073*    (2012.01)
*H01L 21/02*    (2006.01)
(Continued)

(52) U.S. Cl.
CPC ...... *H01L 31/073* (2013.01); *H01L 21/02439* (2013.01); *H01L 21/02474* (2013.01);
(Continued)

(58) Field of Classification Search
CPC .............. H01L 31/073; H01L 31/0445; H01L 21/02439; H01L 21/02474;
(Continued)

(56) References Cited

U.S. PATENT DOCUMENTS

| | | | | |
|---|---|---|---|---|
| 2011/0259424 A1* | 10/2011 | Basol | ............... | H01L 21/02422 136/260 |
| 2013/0280854 A1* | 10/2013 | Jasieniak | ............... | B82Y 30/00 438/93 |
| 2014/0083505 A1* | 3/2014 | Albin | ............... | H01L 21/02422 136/260 |

FOREIGN PATENT DOCUMENTS

| | | |
|---|---|---|
| EP | 1 160 880 A2 | 12/2001 |
| WO | WO 2012/125816 A1 | 9/2012 |

OTHER PUBLICATIONS

Terheggen et al. ("Structural and chemical interface characterization of CdTe solar cells by transmission electron microscopy," Thin Solid Films, 431-432, pp. 262-266, 2003).*

(Continued)

*Primary Examiner* — Yasser A Abdelaziez
(74) *Attorney, Agent, or Firm* — Birch, Stewart, Kolasch & Birch, LLP

(57) ABSTRACT

A method to produce thin film solar cells in superstrate or substrate configuration is an efficient way to minimize the loss due to absorption in CdS layer and to eliminate the $CdCl_2$ activation treatment step. This is achieved by applying a sacrificial metal-halide layer between the CdS-layer and the CdTe-layer of the solar cells.

17 Claims, 2 Drawing Sheets

Figure 1:
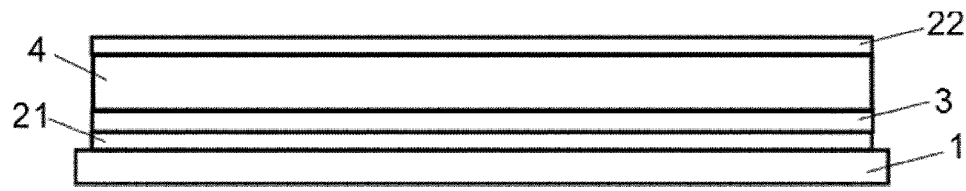

(51) Int. Cl.
  *H01L 31/18* (2006.01)
  *H01L 31/0224* (2006.01)
  *H01L 31/0296* (2006.01)
  *H01L 31/0445* (2014.01)

(52) U.S. Cl.
  CPC .. *H01L 21/02491* (2013.01); *H01L 21/02505* (2013.01); *H01L 21/02562* (2013.01); *H01L 21/02628* (2013.01); *H01L 31/0296* (2013.01); *H01L 31/022425* (2013.01); *H01L 31/022466* (2013.01); *H01L 31/0445* (2014.12); *H01L 31/1828* (2013.01); *H01L 31/1836* (2013.01); *H01L 31/1884* (2013.01); *Y02E 10/543* (2013.01); *Y02P 70/521* (2015.11)

(58) Field of Classification Search
  CPC ......... H01L 21/02491; H01L 21/02505; H01L 21/02562; H01L 21/02628; H01L 31/022425; H01L 31/022466; H01L 31/0296; H01L 31/1828; H01L 31/1836
  USPC ....................................................... 438/73
  See application file for complete search history.

(56) References Cited

OTHER PUBLICATIONS

Barrioz et al. ("In situ deposition of cadmium chloride films using MOCVD for CdTe solar cells," Thin Solid Films, 515, pp. 5808-5813, 2007).*

Dhere et al. ("Influence of CdS/CdTe Interface Properties on the Device Properties," 26th IEEE Photovoltaic Specialists Conference, Sep. 29-Oct. 3, 1997).*

Romeo et al., "Cadmium and Zinc Chloride Treatments of CdS Films for the Preparation of High Efficiency CdTe/CdS Thin Film Solar Cells," 14th European Photovoltaic Solar Energy Conference, Barcelona, Spain, Jun. 30-Jul. 4, 1997, pp. 2351-2353, XP-1136575A.

Xia et al., "Fabrication of $Cd_{1-x}Zn_xS$ Films with Controllable Zinc Doping Using a Vapor Zinc Chloride Treatment," Solar Energy Materials & Solar Cells, vol. 94, 2010 (Available online Jul. 17, 2010), pp. 2113-2118, XP-27383834A.

\* cited by examiner

State of the Art

METHOD FOR PRODUCING THIN-FILM SOLAR CELLS

The objective of the present invention is a method of producing CdTe solar cells with increased efficiency.

The distribution of thin-film solar cells may be accelerated further by increasing their electric efficiency in light conversion. Solar cells based on CdTe have proven particularly promising in this respect.

In the state of the art, the CdTe solar cell has the following structure: on a glass substrate, a transparent conducting oxide layer (TCO) is deposited as front contact. The TCO layer can include a high resistive buffer layer which helps to minimise the shunting effect in solar cell. On this, a layer of cadmium sulfide (CdS) and on top of that, a layer of cadmium telluride (CdTe) are deposited. Finally a metal layer is applied to collect the charge carriers. This process is called superstrate configuration.

It is well known in the state of the art that CdTe solar cells can also be built in a reverse succession. This starts with the backside substrate (glass) on which the backside contact layer (or layers) is deposited (also in reverse succession). On the backside contact layer the CdTe-layer (or layers) is grown, followed by the CdS layer. On top of the CdS-layer TCO layer (or layers) is deposited. This process is named substrate configuration.

It is apparent to a person skilled in the art that the procedure according to the present invention is usable for solar cells made in superstrate or in substrate configuration. Often, supporting layers (such as anti-reflection coating) are intended to facilitate the light entering into the glass substrate. Also an additional glass is often used to protect the back side against damage. The completion of module production process which includes laser scribing or mechanical scribing, electrical contacts, edge sealing etc., are according to the state of art. Such supporting layers, protective glass and module preparation process are known from prior art, and their optional presence is understood henceforth, and are not explained in more detail.

In producing the solar cells the substrate (preferably glass) forms the base on which the subsequent layers are deposited one after another.

Research has shown that CdS is a particularly well suited compound partner for CdTe. Without the CdS layer, the production of high efficiency CdTe solar cells is hardly possible. However, light absorption of CdS is in the blue range of the visible spectrum, and does not produce useful photocurrent. Therefore, one goal in producing CdTe solar cells is to make the CdS layer as thin as possible. However, if the CdS layer gets too thin, this results in short circuits ('pin holes') between the TCO layer and the CdTe layer, which strongly affects the efficiency of the solar cell. Alternatively increasing the CdS layer band gap can help to reduce the blue light absorption in CdS layer.

In the production of CdTe solar cells, according to the state of art, the high efficiency solar cells are made with a $CdCl_2$ treatment step so called activation step. A typical activation step involves application of $CdCl_2$ onto the CdTe layer by wet chemical method or by vacuum evaporation followed by annealing in air atmosphere at defined temperature (normally in the range of 380° C.-440° C.). The benefits of activation step include reduction of lattice match between the CdS/CdTe layers and CdTe layer grain boundary passivation. The $CdCl_2$ activation induced inter-diffusion between the CdS and CdTe layer helps to achieve smooth electronic band transition at the CdS/CdTe junction. A disadvantage of this approach is that the $CdCl_2$ is a potentially hazardous material and therefore difficult to manage.

The objective of this invention is to minimise the loss due to absorption in CdS layer and eliminating $CdCl_2$ activation treatment step. Furthermore it is an objective to increase the band gap of the CdS-layer to reduce its absorption in the visible spectrum of light.

The visible light absorption in CdS layer can be minimised by increasing CdS band gap with selected dopants such as Zn.

According to the invention, it is suggested to apply, during the production process, a metal-halide sacrificial layer, preferably a $ZnCl_2$ sacrificial layer, between the CdS and CdTe layers.

The preferred metal for the metal-halide sacrificial layer is Zinc (Zn). The preferred halides for the metal-halide sacrificial layer is Fluoride (F), most preferred Chloride (Cl). The preferably used compounds are thus $Zn F_2$ and most preferably $ZnCl_2$. Further preferred are composites of metal-halide compounds with additional halides (preferably Fluor or Chlorine) above the stoichiometric ratio of the metal-halide-compound.

In the production of solar cells, processes involving higher temperatures are used. During these processes, the metal-halide sacrificial layer changes in such a manner that the metal-halide splits into its components, with the metal preferably diffusing into the CdS layer, whereas the halide moves preferably into the CdTe layer. Thus, the major part of metal-halide layer or even the complete layer is broken down during the production process, which characterises the metal-halide layer as a sacrificial layer.

The CdS layer is applied according to well-known methods from prior art, such as, for example, close space(d) sublimation (CSS) or chemical bath deposition (CBD).

The metal-halide sacrificial layer can be applied using methods according to state of the art. Preferably used are physical wet or dry chemical processes such as, but not limited to:

Spraying solution of metal-halide dissolved in water or in another known solvent Spin coating, Dipping the substrate (or the CdS layer surface) into a solution which contains metal and halide atoms.

Sponge roller coating, etc.

When applying the metal-halide sacrificial layer, according to one of the methods mentioned above, the concentration of the solution used is not the primary concern. The main objective is to attain the desired layer thickness. In principle, not only methods using metal-halide solutions, but also other methods are suitable, such as vapour deposition, or creation of the metal-halide layer from other compounds, preferably using metal-halide derivatives in a chemical reaction. Here care should be taken that the CdS layer does not suffer damage.

The metal-halide sacrificial layer is preferably applied in the temperature range of 10° C. to 100° C., duly considering the parameters of the method selected.

The thickness of the metal-halide sacrificial layer depends on the dimensions of the two neighbouring layers. According to the invention, it is preferably in the range of 5 nm to 1000 nm, more preferably in the range of 5 nm to 100 nm, and most preferably in the range of 5 nm to 20 nm.

The thermal energy available during the CdTe layer growth or post treatment procedure induces decomposition of the metal-halide sacrificial layer into its components and diffuses into the nearby layers. The diffusion of metal atoms into the CdS layer helps to increase the band gap of the CdS layer, thus helps to minimise the blue light absorption in CdS layer. Therefore, the short circuit current of the solar cell device can be increased. The deposition of the CdTe layer onto the metal-halide sacrificial layer can be achieved according to the state of the art. The thickness of the CdTe layer is preferably in the range of 1000 nm to 8000 nm.

In a particularly preferred procedure, the CdTe layer is made to grow, up to approx. 25% of its final thickness in the (substrate's) low temperature range of preferably ca. room temperature (20° C.) to 200° C., particularly preferably of 25° C. to 100° C. on the metal-halide sacrificial layer. Subsequently the process is continued in the temperature range of preferably 200° C. to 550° C., particularly preferably of 350° C. to 500° C. until the desired layer thickness is attained. The advantage of this procedure is that, on the $ZnCl_2$ layer, a layer of smaller CdTe crystals grows which is covered by a layer of larger CdTe crystals. The method of growing CdTe layer also has an additional advantage of reducing pinhole formation in CdTe layer. While the CdTe layer is growing, the major part of the metal-halide is thermally broken down, and its constituents are diffusing into the neighbouring layers. Hereby the metal, due to electrochemical laws, preferably moves into the CdS layer, whereas the halide moves preferably into the CdTe layer. In the CdS layer, preferably $Cd_{1-x}Metal_xS$ (x=0 . . . 1) and in the CdTe layer preferably $Cd_{1-x}Metal_xTe$ (x=0 . . . 1) are generated, whereby the diffusion of metal mainly (though not exclusively) takes place in the direction of the CdS layer. Such diffusion of metal into CdS and CdTe layer helps to minimise the lattice mismatch and also helps to produce smooth band transition at the junction. Additionally diffusion of Cl into CdTe layer helps for grain boundary passivation. According to the state of art such diffusion of halide and grain boundary passivation normally achieved through $CdCl_2$ activation process. Therefore, the process mentioned in this invention mimics the $CdCl_2$ activation process. In addition to this, due to the metal diffusion in to the CdS layer, the CdS layer band gap advantageously increases. In case if $SnO_2$ high resistive buffer layer is used, then during the device preparation process some Cd atoms from CdS can also diffuse into the $SnO_2$ layer.

As a result, the metal-halide sacrificial layer is to a large degree or completely exhausted, and the CdS layer and the CdTe layer are now bordering on each other. The breakdown of the metal-halide sacrificial layer may be optionally enhanced or completed by means of an additional temperature step which includes heating the substrate to a temperature in the range of 300° C. to 550° C.

Advantageously in this manner the $CdCl_2$ activation step may be avoided and the $CdCl_2$ eliminated from the process. However, this step may still be performed as an option. In the back contact process, according to the state of art, in case of Cu based back contact procedure; the metal contact can be made without etching the CdTe layer. Alternatively, in case of Cu free back contact, the CdTe layer can also be etched and metal contact can be made, all according to the state of the art.

The above is true for solar cells in superstrate configuration. A person skilled in the art understands that an analogue process is possible for solar cells in substrate configuration. In the production process of substrate configuration solar cells the steps are performed basically in a reverse order, Thus on the substrate the back contact is applied, followed by the CdTe-layer, the metal-halide sacrificial layer, the CdS-layer and the transparent front contact layer. It is necessary to observe that, if the CdS-layer is deposited with the CSS-process the metal-halide layer could break down because of the heat and evaporate before the CdS-layer reaches a sufficient thickness. For that reason the CdS-layer is preferably deposited, at least for a part of its intended thickness, at lower temperatures. This could be done by using another process than CSS, for example by sputtering or wet chemical deposition. Another possibility is to use a two-step process analogue to the deposition of CdTe with CSS at two different temperatures, first at a lower temperature than at a higher temperature. By usage of the CSS-process the first partial layer (or sublayer) (preferably 25% of the intended thickness) is produced in a temperature range from 100° C. to 200° C. The remaining is produced preferably in the temperature range of about 350° C. up to 550° C. Because at least the second partial layer of the CdS-layer is produced substantially at the same thermal and procedural conditions (CSS-process) as the CdTe-layer the breakdown of the metal-halide sacrificial layer takes place in the same way as for the superstrate configuration production process. Optionally also in the production process of substrate configuration solar cells an additional annealing step for decomposing the metal-halide sacrificial layer may be required.

By using the method as described, the yield may be advantageously increased when the incident light is transformed into current. Increase in conversion efficiency of ca. 1% from 12% to 13% was observed.

FIGURES

FIG. 1 schematically shows the layer structure of a solar cell according to the state of the art. Said solar cell comprises on the substrate (1) a layer sequence consisting of front contact (21), CdS layer (3), CdTe layer (4) and back contact (22).

FIGS. 2a to 2e schematically shows the layer sequences, as they may be observed during the course of the method according to the invention.

EXEMPLARY EMBODIMENT

The method according to the invention is explained in the following in a first exemplary embodiment showing the making of a solar cell in superstrate configuration, without intending to imply a restriction to said embodiment.

Figure 2A:
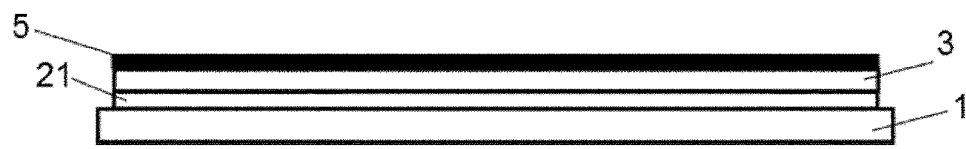

In FIG. 2a on the substrate (1) the front contact (21) and the CdS layer (3) have already been applied by means of methods according to the state of the art. As front contact (21), a 450 nm thick transparent bi layer [Fluorine doped tin oxide (350 nm) as conducting layer and tin oxide (100 nm) as high resistive buffer] was applied (as TCO). The CdS layer (3) reaches a thickness of 90 nm and was deposited using CSS technique. On this, the sacrificial layer (5) of $ZnCl_2$ according to the invention is deposited. This was applied by spraying the $ZnCl_2$ solution (dissolved in water) and by subsequently drying at 80° C. The thickness of the $ZnCl_2$ layer is about 15 nm.

Figure 2B:
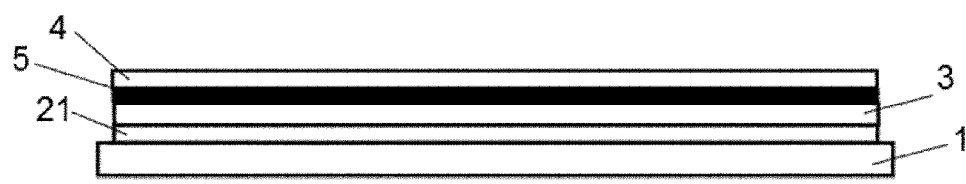
Figure 2C:
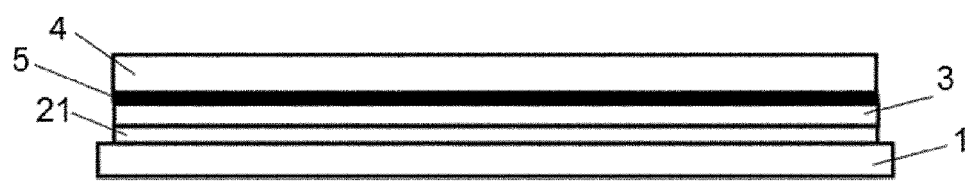

FIGS. 2b and 2c schematically show how the sacrificial layer (5) above the CdTe layer is deposited. In a first step (FIG. 2b) a CdTe layer (4) with a thickness of 1500 nm is deposited by means of CSS at a temperature of 120° C. Afterwards (FIG. 2c) the substrate temperature is increased to 450° C. and about 3500 nm of CdTe is deposited. The total thickness of CdTe layer is about 5000 nm. The sacrificial layer starts to break up during the deposition of CdTe at 450° C., and the Zn ions preferably move into the CdS layer (3), while the Cl ions diffuse preferably into the CdTe layer and thus helping for CdTe grain boundary passivation. In general, if required, an additional thermal step can be performed. This may help to completely break-up the sacrificial layer (5). In case if necessary, the regular $CdCl_2$ activation treatment can be performed but with reduced $CdCl_2$ amount and/or treatment time.

Figure 2D:
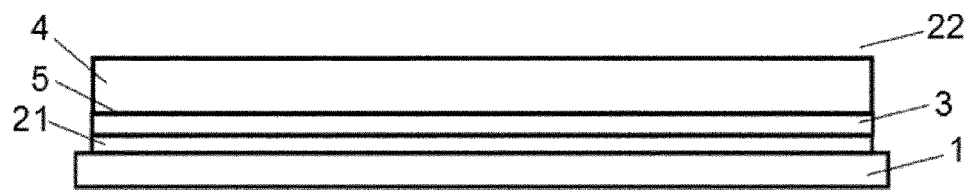

FIG. 2d schematically shows that the sacrificial layer (5) is nearly completely broken down after the thermal treatment in the process of the CdTe deposition.

Figure 2E:
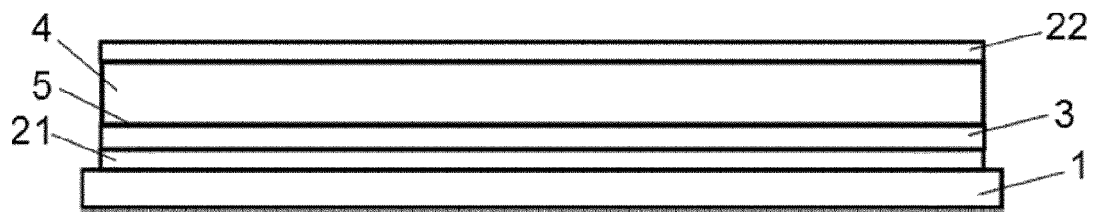

FIG. 2e schematically shows that as a result of the method according to the invention, after completing the back contact procedure with metal layer. (22) (made of Mo), a solar cell has been created having a layer sequence which corresponds to that known from prior art. In detail, concentration gradients of the Zn ions in the CdS layer (3) and of the Cl ions in the CdTe layer (4) arise through the diffusion process. These diffusion gradients point to the use of the method according to the invention.

REFERENCE NUMERALS

1 Substrate (glass)
21 Front contact (transparent, TCO)
22 back contact (metal)
3 CdS layer
4 CdTe layer
5 $ZnCl_2$ layer

The invention claimed is:

1. A method for producing a solar cell in a superstrate configuration, comprising the steps:
   a. making available a transparent substrate,
   b. applying a transparent front contact layer,
   c. applying a CdS layer,
   d. applying a sacrificial layer of a metal-halide compound,
   e. applying a CdTe layer and break-up of the sacrificial layer, including diffusion of the major part of the metal ions into the CdS layer and the major part of the halide ions into the CdTe layer, wherein the CdTe layer from a first partial layer with a percentage of up to 25% of the total layer thickness is produced, in a temperature range of room temperature to 200° C., and the remaining second CdTe partial layer is produced in a temperature range of 350° C. to 550° C., and
   f. applying the back contact layer.

2. A method for producing a solar cell in substrate configuration, comprising the steps:
   a. making available a substrate,
   b. applying the back contact layer
   c. applying a CdTe layer
   d. applying a sacrificial layer of a metal-halide compound,
   e. applying a CdS layer and break-up of the sacrificial layer, including diffusion of the major part of the metal ions into the CdS layer and the major part of the halide ions into the CdTe layer, wherein the CdTe layer from a first partial layer with a percentage up to 75% of the total layer thickness is produced in a temperature range of 350° C. to 550° C. and the remaining second CdTe partial layer is produced in a temperature range of room temperature to 200° C., and
   f. applying a transparent front contact layer.

3. The method according to claim 1, wherein the step b. is performed with an additional suitable high resistive buffer layer.

4. A method for producing a solar cell in substrate configuration, comprising the steps:
   a. making available a substrate,
   b. applying the back contact layer
   c. applying a CdTe layer
   d. applying a sacrificial layer of a metal-halide compound,
   e. applying a CdS layer and break-up of the sacrificial layer, including diffusion of the major part of the metal ions into the CdS layer and the major part of the halide ions into the CdTe layer, the CdS layer from a first partial layer with a percentage up to 25% of the total layer thickness is produced in a temperature range of 100° C. to 200° C. and the remaining second CdS partial layer is produced in a temperature range of 350-550° C., and
   f. applying a transparent front contact layer.

5. The method according to claim 1, wherein step e. is performed at temperatures in the range of 100° C. to less than 550° C.

6. The method according to claim 1, wherein after step e. an additional $CdCl_2$ activation step is performed.

7. The method according to claim 1, wherein after step e. a temperature treatment step at a temperature in the range of 300° C. to 450° C. is performed.

8. The method according to claim 1, wherein the sacrificial layer is made from $ZnCl_2$ or $ZnCl_2$ derivatives.

9. The method according to claim 8, wherein the sacrificial layer additionally includes other suitable metal chlorides appropriate to increase the band gap of the CdS layer.

10. The method according to claim 1, wherein the metal-halide-compound of the sacrificial layer is dissolved in a suitable solvent in step d.

11. The method according to claim 1, wherein the metal-halide-compound of the sacrificial layer consists of Zn as the metal and Fluorine or Chlorine as the halide.

12. The method according to claim 1, wherein the metal-halide-compound of the sacrificial layer contains additional Fluorine or Chlorine above the stoichiometric ratio of the metal-halide-compound.

13. The method according to claim 2, wherein step f. is performed with an additional suitable high resistive buffer layer.

14. The method according to claim 2, wherein step e. is performed at temperatures in the range of 100° C. to less than 550° C.

15. The method according to claim 1, wherein step e. is performed at temperatures in the range of 100° C. to less than 550° C.

16. The method according to claim 2, wherein step e. is performed at temperatures in the range of 100° C. to less than 550° C.

17. The method according to claim 4, wherein step e. is performed at temperatures in the range of 100° C. to less than 550° C.

* * * * *